United States Patent [19]

Sibley

[11] Patent Number: 4,751,636
[45] Date of Patent: Jun. 14, 1988

[54] MEMORY MANAGEMENT METHOD AND APPARATUS FOR INITIALIZING AND/OR CLEARING R/W STORAGE AREAS

[75] Inventor: Henry C. Sibley, Adams Basin, N.Y.

[73] Assignee: General Signal Corp., Stamford, Conn.

[21] Appl. No.: 13,169

[22] Filed: Feb. 3, 1987

Related U.S. Application Data

[63] Continuation of Ser. No. 590,817, Mar. 16, 1984, abandoned, which is a continuation-in-part of Ser. No. 241,819, Mar. 9, 1981, Pat. No. 4,485,435.

[51] Int. Cl.⁴ .................................. G06F 11/00
[52] U.S. Cl. .................................. 364/200; 371/24
[58] Field of Search ... 364/200 MS File, 900 MS File; 371/21, 25, 27, 24

[56] References Cited

U.S. PATENT DOCUMENTS

| | | | |
|---|---|---|---|
| 3,579,199 | 5/1971 | Anderson et al. | 364/200 |
| 4,181,849 | 1/1980 | Sibley | 364/900 |
| 4,195,770 | 4/1980 | Benton et al. | 371/21 |
| 4,300,234 | 11/1981 | Maruyama et al. | 371/21 |
| 4,320,454 | 3/1982 | Suzuki et al. | 364/200 |
| 4,335,457 | 6/1982 | Early | 371/21 |
| 4,369,511 | 1/1983 | Kimura et al. | 371/21 |
| 4,370,746 | 1/1983 | Jones et al. | 371/21 |
| 4,373,182 | 2/1983 | Schultz et al. | 364/200 |
| 4,384,348 | 5/1983 | Nozaki | 371/21 |
| 4,402,081 | 8/1983 | Ichimiya et al. | 371/27 |
| 4,414,665 | 11/1983 | Kimura et al. | 371/21 |
| 4,456,995 | 6/1984 | Ryan | 371/21 |
| 4,485,435 | 11/1984 | Sibley | 364/200 |
| 4,509,112 | 4/1985 | Saiji | 364/200 |
| 4,553,225 | 11/1985 | Ohe | 371/21 |

Primary Examiner—Thomas M. Heckler
Assistant Examiner—Kevin A. Kriess
Attorney, Agent, or Firm—Pollock, Vande Sande & Priddy

[57] ABSTRACT

A method for vital memory management of data. A method is disclosed for clearing on specified conditions and for assuring the clearing is effected. Both random access and stack operation are implemented. Clearing the memory area requires reading the contents of a given location and, assuming expected data is read, going on to process the next memory location. In one embodiment the contents of the given location are used to access the next location, thereby assuring that if unexpected data is read the process will not proceed normally.

8 Claims, 8 Drawing Sheets

FIG. 6A  DATA MEMORY CLEAR, TEST, DELAY

FIG. 7A  VITAL MEMORY TEST AND DELAY

MEMORY MANAGEMENT METHOD AND APPARATUS FOR INITIALIZING AND/OR CLEARING R/W STORAGE AREAS

RELATED APPLICATION

This is a continuation of co-pending application Ser. No. 590,817 filed Mar. 16, 1984, now abandoned, which is a continuation-in-part of applicant's prior co-pending application Ser. No. 241,819 filed Mar. 9, 1981 and assigned to the assignee of this application, now U.S. Pat. No. 4,485,435.

TECHNICAL FIELD

This invention relates to computer memory management techniques and apparatus.

BACKGROUND ART

A hazard in communications and data processing systems used in transportation controls (or other applications where safety is important) is the inadvertent use of information that is no longer correct. The probability of this hazard coming to pass is relatively high in a computer or processor based system wherein data can be stored in read/write memories. The data management techniques disclosed herein ensure appropriate management of the contents of the data memory so that inappropriate data is destroyed.

Depending on the system, inappropriateness of retaining data can occur at various times. In some systems data is intended to be used once and once only, and thereafter discarded; accordingly, in this context memory must be managed so that once the data is read it is destroyed. In other environments or contexts, the data may be retained for predetermined periods, or periods fixed dependent upon other parameters and in those contexts, data only becomes inappropriate when the specific condition is fulfilled, and accordingly, the appropriate data management techniques ensure the destruction of data only when the condition has been fulfilled.

A typical memory variety is the so-called data stack, which can be conceived of as sequential data arrangement in which data may be extracted from a fixed location only, and to ensure that capability is present, when a piece of data is extracted, each remaining piece of data is moved one memory unit closer to the predetermined location. In this context, data becomes inappropriate for use after it has been extracted and thus, appropriate data management techniques require that in the course of shifting data up and back, memory areas from which data has been extracted are operated with to ensure that extracted data no longer remains.

A further problem which may be present in processor based systems is the necessity to provide for an automatic restart capability for power or noise caused failures. The prior art has provided apparatus and techniques to accomplish this function. A problem can develop, however, in the response of associated equipment to such a restart. In the worst case, if the failure is permanent, the processor is cyclically restarted. This can be interpreted by auxiliary equipment as normal functioning if the cycle is short enough and unless positive steps are taken it would be foolish to merely assume the cycle is otherwise long enough to prevent this condition. If the system output governs or contributes to safety then it is essential that repetitive restarts of a processor be recognized as such and not mistaken for normal operation.

SUMMARY OF THE INVENTION

It is therefore, one object of the present invention to provide data management methods and/or apparatus whose use will ensure that, depending upon the particular context, inappropriate data is not retained. Furthermore, it is another object of the present invention to provide data memory management methods and/or apparatus which is arranged to enable a check to be effected to ensure use of appropriate operating procedures and/or apparatus.

In connection with the context which requires data to be destroyed once it is read, one aspect of the invention comprises a method of assuring that a computer memory area has been cleared of preexisting data before further employing said memory area, which memory area is located between initial and final addresses and is addressed by a pointer, the method comprising the steps of:

(a) initially loading said pointer with an address between said initial and final address, (b) writing a predetermined data word into location addressed by the pointer, (c) modifying the contents of said addressed memory location in a predetermined fashion, (d) using the modified contents of the addressed location in a subsequent program step, and (e) repeating steps (b) to (d) for each other location with the memory area.

For example, in one specific embodiment of the invention the modification effected to the contents of the addressed memory location (step c) can comprise merely incrementing those contents. Under those circumstances, the address initially loaded into the pointer is the initial address. On the other hand, the modification effected in said step (c) can comprise decrementing the contents of the addressed memory location, in which event the address initially loaded into the pointer is the final address. In either event, each memory location, beginning either at the initial or final address, is written to ensure that it contains a quantity other than data which may have been stored therein, and this is effected by first writing into that location its own address, and then using that as a basis, modifying the contents of that location so as to reach other locations which have not yet been processed. By appending an appropriate check subsequent to step e, to ensure that an address other than the one at which the pointer was initially loaded with, is reached, one can be assured that each and every location between the initial and final addresses has been cleared of any preexisting data.

Those skilled in the art will readily appreciate that it is not essential that the predetermined data word (of step b) be the memory location's address. It is merely necessary that the predetermined data word written at step b be coordinated with the particular modification of the contents of the addressed location (step c) so that the desired result of step d, be achieved, that is, that the modified contents of the memory location can be used to address another location. For example, the predetermined word (of step b) could be a word which is a function of the addresss, but not necessarily identical thereto. For example, the predetermined word could be a number one less than the memory location's address. In that event, step c would be performed by incrementing the contents, by a quantity two. Equally effective would be decrementing the location's address by any given number so long as the step c comprised adding a number which was one more than the amount by which the address was decremented to reach the predetermined data word. On the other hand, the predetermined data word could be the sum of the address and any given number, so long as the step c operation comprised decrementing the contents of the memory location by a number one less than the amount by which the address had been incremented to reach the predetermined data word. There is no reason for example, that the address location could not be incremented by one to become the predetermined data word. In such event, of course, the net result of step c would be the addition of the quantity zero, but that could be achieved, in step c, by adding and subtracting equal amounts from the contents of the memory location, or other equivalent operations, a one-bit right shift followed by a one-bit left shift, for example, for step c. On the other hand, the predetermined data word could be a constant, i.e. not a function of the memory location's address. For example, consider that the predetermined data word corresponded to a constant K. Step c could then be initiated first on determining that the correct constant was read from the memory location, and in that event, a branch could be made to an independent counter loop which would select the quantity to be substituted for the constant K, and of course that quantity would be the addressed of the next location.

In the event that the method described above is employed in connection with data which is to be destroyed when it is read, preexisting data in each memory location is extracted subsequent to step a, but prior to step b. On the other hand, the foregoing method can be employed with data which may be read a number of times, in which event, the method described is only employed when the data becomes inappropriate to retain.

BRIEF DESCRIPTION OF THE DRAWINGS

The invention will now be described so as to enable those skilled in the art to practice the same in the following portion of the specification when taken in conjunction with the attached drawings in which like reference characters identify identical subject matter, and in which:

FIGS. 4, 7A and 7B are block diagrams of other embodiments of the invention.

DETAILED DESCRIPTION OF THE INVENTION

A variety of embodiments of the invention can be implemented on a microprocessor such as the INTEL 8048 family microprocessor. The instruction sequence of one embodiment of the invention is described in FIG. 1, and this requires the use of a hardware pointer, as well as a memory start address, indicating the beginning of the memory area to be read (and purged) as well as the last memory address in this area, and a test word having predetermined characteristics.

Figure 1:
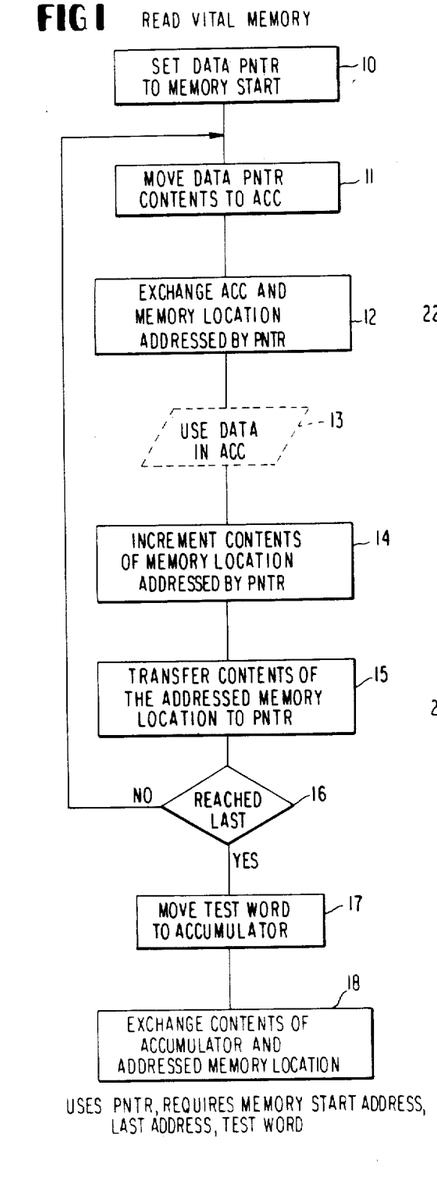
FIGS. 1-3 and 6A-6C are flow charts illustrating processor function comprising different embodiments of the invention.

As shown in FIG. 1, when it is desired to read the memory in a vital fashion, steps 10 through 13 are initiated; step 10 sets the data pointer to the memory start address. Step 11 moves the contents of the data pointer to the accumulator (ACC).

Step 12 exchanges the contents of the ACC and the memory location addressed by the pointer. At this point, the accumulator holds the data and the memory location has its own address. Accordingly, the memory location has been purged of its data. At this point, the data word in the accumulator can be used as indicated by step 13 shown in dashed outline.

Step 14 increments the contents of the memory location addressed by the pointer and step 15 transfers the contents of the addressed memory location to the pointer.

Steps 14 and 15 cause the data pointer to be incremented to point to the next memory location, but this is effected by using contents of one of the addressed memory locations, ensuring that the next memory location cannot be achieved until the previous memory location has been purged of its data. Step 16 determines whether or not the last memory address has been reached; this is easily effected by using the known last address of the memory area being purged.

Assuming that each of the memory addresses to be purged has not been processed, the routine loops back and repeats steps 11 through 15 until each of the memory locations has been used.

When the last memory location is reached, step 17 is effected to move the test word into the accumulator, and step 18 exchanges the contents of the accumulator and the addressed memory location.

This completes the purging; and note that in step 18 a test word has been placed in the last memory location. An independent routine can now (or at a later time) access this location by appropriately setting the pointer, retrieving the test word, which can be independently tested, as a check to prove that the memory area has actually been purged. Unless the memory area has been purged the test word would not be found in the specified location.

While other microprocessors, mini-computers or computers might have slightly different instruction sets, one of the key features of the invention is the use of the contents of a previously processed memory location to reach unprocessed memory locations. Those of ordinary skill will understand that the incrementing step (step 14) is not essential to the invention, and rather than moving up in memory address space (by using the incrementing step), the method can be practiced by moving down in memory address space (by starting at the last memory address and decrementing rather than incrementing). Other techniques for moving in the memory space will also be apparent, and are compatible with the present invention.

Figure 2:
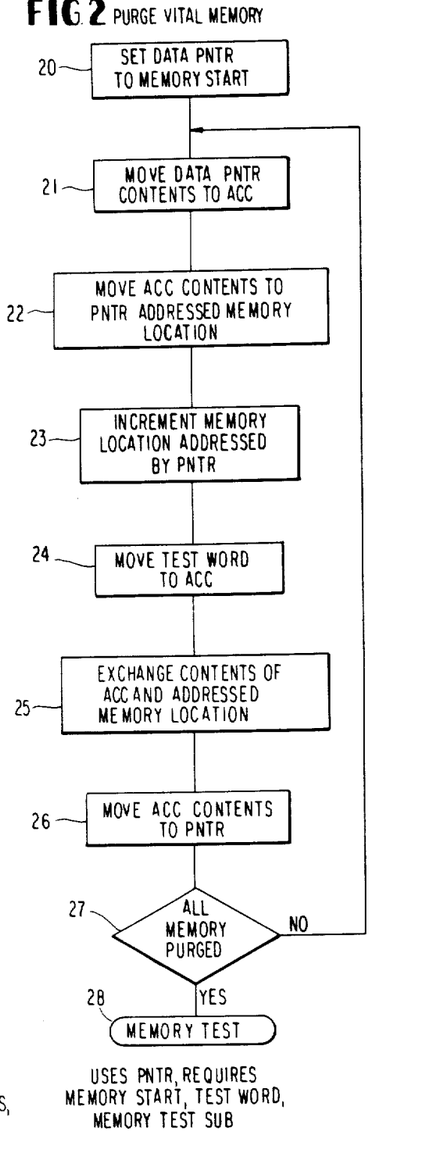

As has been mentioned, in a variant of the invention, it is desired to purge the memory area of its data only at selected times, for example when a predetermined condition is satisfied. Under these circumstances, the routine shown in FIG. 2 is employed, which requires, in addition to the hardware and other parameters required by FIG. 1, a memory test sub-routine. The steps down in FIG. 2 are entered only when the pre-existing condition has been satisfied such that it is desired to purge a memory area.

As shown in FIG. 2, step 20 sets the data pointer to the memory start address. Step 21 moves the data pointer contents to the accumulator, and step 22 moves the accumulator contents to the addressed memory location. Note that in this routine, the data is overwritten and not extracted since it is assumed that the data has been previously employed. Step 23 increments the memory location addressed by the pointer, step 22 had written the memory location's address into its contents, and thus step 23 uses that data to reach another memory location, as will now be explained.

Step 24 moves a test word to the accumulator and step 25 exchanges the contents of the accumulator and the addressed memory location. At this point, the memory location contains the test word and the accumulator contains the address of the next memory location. Step 26 moves the accumulator contents to the pointer. Step 27 determines whether or not the memory has been completely purged, and if not, the routine loops back to step 21. While step 27 can be implemented in a variety of ways, two will be outlined. A first option is to compare the address of each location being processed with a reference equal to the address of a memory location reached when processing is complete. An equal or greater comparison indicates completion. Another option is to set up a loop counter with a number equal to the number of locations to be processed, and decrement the counter once per location processed. When the counter reaches zero (or below) processing can be terminated. Assuming that it is determined in step 27 that all memory locations have been purged, then a memory test 28 is effected. This memory test is an independent routine to prove that each and every location contains a test word placed there after data has been destroyed. This memory test can use a check sum or signature analysis, and require the appropriate result to allow any further steps to be effected. Note that, as in the first embodiment of the invention, the test word written to each memory location, at step 25, may be its own address.

Figure 8:
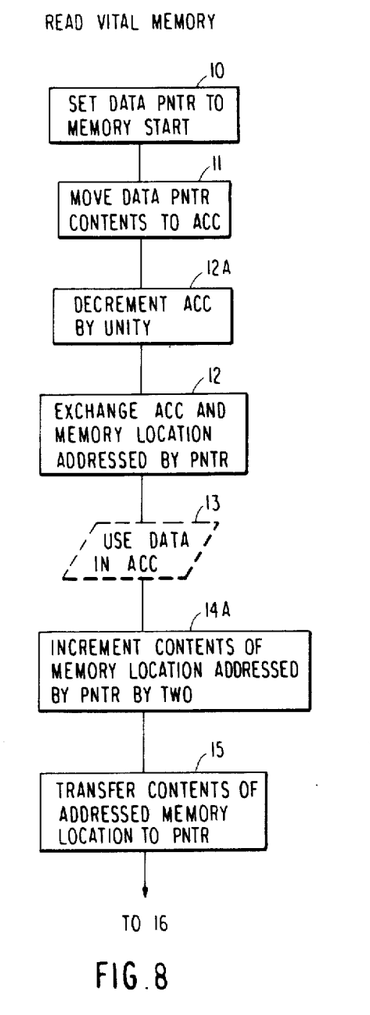
FIGS. 8 and 9 illustrate flow charts comprising modifications to the routines shown in FIGS. 1 and 2.
Figure 9:
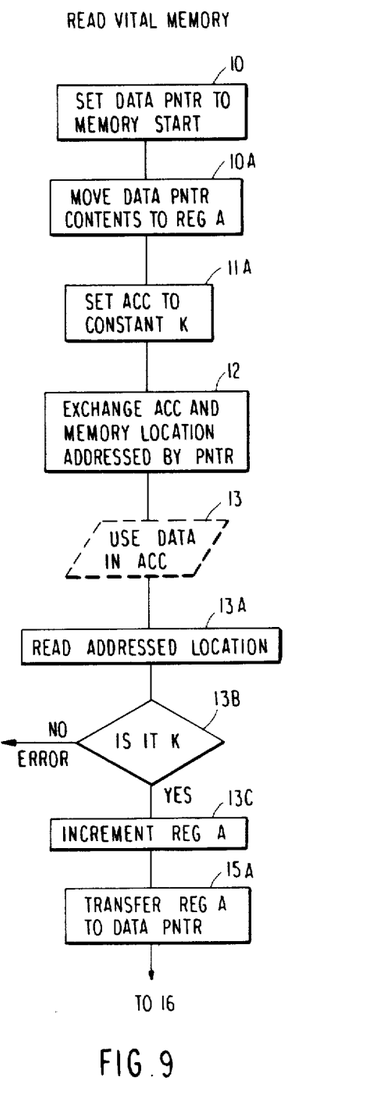

Whereas FIGS. 1 and 2 illustrate the use of a "predetermined data word" which is the memory location's address, FIGS. 8 and 9 illustrate that the predetermined data word need not be the memory location's address.

FIG. 8 illustrates one embodiment of the invention wherein the predetermined data word is not the memory location's address, but is a function of the memory location's address. More particularly, FIG. 8 shows functions 10–15 (including functions 12A and 14A) which can be substituted for functions 10–15 of FIG. 1. Those functions carrying identical reference characters to the functions in FIG. 1 are in fact identical to those functions. Thus, function 10 sets a data pointer to a memory start address. Function 11 moves the contents of the data pointer to the accumulator. Function 12A decrements the contents of the accumulator by unity, and as a result the accumulator now contains a quantity which is one less than the quantity contained in the data pointer. Step 12 exchanges the contents of the accumulator and the memory location addressed by the pointer. At this point in time, the accumulator now contains the data that was in the addressed memory location, and the addressed memory location contains not its own address, but its address decremented by unity. Function 13 can be performed if the data read from the memory is important. Function 14a now modifies the contents of the memory location addressed by the pointer, by increasing those contents by the quantity two. At this point, the addressed memory location now contains the address of the next memory location. Thereafter, step 15 transfers the contents of the addressed memory location to the pointer. As a result, the processed memory location now includes the address of the next memory location, and the pointer contains the same address, e.g. the address of the next memory location. Thereafter, the remaining steps of FIG. 1 can be carried out in the identical fashion. The embodiment of FIG. 8 illustrates that the predetermined data word written to the addressed memory location need not be the address of the memory location itself, but can be a function of that memory location. Specifically illustrated in FIG. 8 is the case in which the predetermined data word is one less than the addressed memory location. In a similar fashion, the predetermined data word can be any given constant less than the address merely by changing function 14A to compensate for the difference. In the similar fashion, step 12A could be an incrementing function as opposed to a decrementing function, with likewise corresponding changes in function 14a. For those cases in which the predetermined data word is the memory location's address incremented by a non-unity quantity, those skilled in the art will readily appreciate how function 14a can be modified to compensate and achieve the results of the invention. However, the invention also comprehends the predetermined data word being the address of the next memory location. In this event, of course, step 14a must result in no net change to the contents of the addressed memory location. However, merely because no net change is required does not mean that no modification at all can be effected. Rather, compensating changes can be made, if desired or step 14a could be a no-operation step.

The preceding description has indicated that the predetermined data word can be a word other than the address of the memory location, so long as it is some function of the memory location's address. FIG. 9 is a flow chart illustrating operation of the invention when the predetermined data word is not a function of the memory location's address. In FIG. 9, those functions which are identical to the functions of FIG. 1 use the same reference characters. Thus, function 10 is identical to function 10 previously described. Function 10A moves the contents of the data pointer to a register A. Function 11A sets the accumulator to a constant value K. Function 12 exchanges the contents of the accumulator and an addressed memory location. At this point, the addressed memory location contains the quantity K, and the accumulator contains the data previously resident in the addressed memory location. At this point, function 13 can be performed if the data is to be used. Thereafter, function 13A reads the addressed memory location. Function 13B checks to see if it is in fact the constant K. If not, that is an error and the routine branches to an error output. Assuming the addressed memory location indeed contains the constant K, then function 13C increments the quantity in the register A. At this point, the quantity in the register A is the address of the next memory location. Function 15A transfers the contents of register A to the data pointer, and the remaining functions of FIG. 1 can now be performed. FIG. 9 thus is an example of the use of the invention in which the predetermined data word which is written in an addressed memory location is not a function of the memory location's address. In this case, it is a constant K. If desired, the constant can be changed on each iteration. This requires changing the constant used in step 11A as well as the test in step 13B.

Figure 3:
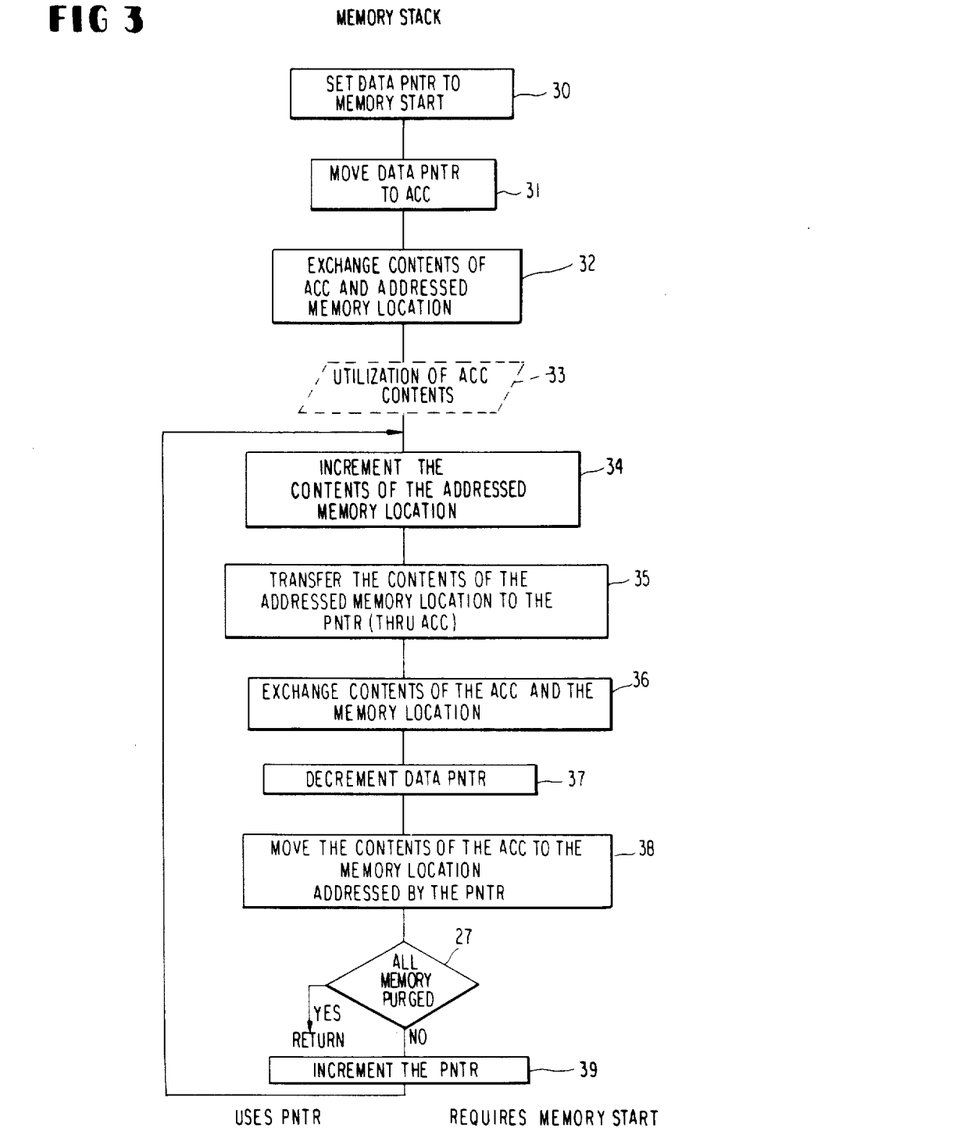

In another context, the invention may be operated with a memory stack, i.e. a first in first out type memory. This is illustrated in FIG. 3. Thus, in addition to the memory management techniques effected by the routines of FIGS. 1 and 2, the routine of FIG. 3 must maintain a stack which requires, when a piece of data is to be written, moving the contents of each other memory location to an adjacent location to allow room for the newly written data, and conversely, when a memory location is read out, requires moving the contents of each memory location to an adjacent location to close up the stack. Since the routine of FIG. 3 is presented in connection with reading out a first in first out memory, the invention is incorporated with memory management techniques to close up the space created by reading out the memory location. Accordingly, function 30 sets a data pointer to the memory start address, function 31 moves the contents of the data pointer to an accumulator and function 32 exchanges the contents of the accumulator and the addressed memory location. As in the case of FIG. 1, the addressed memory location now contains its address, and the accumulator contains its data. Accordingly, function 33 is provided to allow utilization of the contents of the accumulator. Thereafter, function 34 increments the contents of the addressed memory location. At this point, the addressed memory location contains the address of the next memory location. Function 35 transfers the contents of the addressed memory location to the pointer (through the accumulator). Thus, following this step, both the pointer and the accumulator contain the address of the next memory location to be processed, and the memory location last processed contains its own address.

Function 36 exchanges the contents of the accumulator and the memory location addressed by the pointer. At this point, the newly addressed location contains its own address, and the accumulator contains its data. Function 37 now decrements the data pointer, so that it points to the first processed memory location. Function 38 moves the contents of the accumulator (which contains the data of the addressed memory location) to the memory location addressed by the pointer. Following function 38 therefore, the contents of the second addressed memory location is placed in the first addressed memory location. Function 27 determines if processing is completed. If not, function 39 increments the pointer so that it again points to the second addressed memory location; and at this point, the routine loops back to function 34. Thereafter, functions 34 through 39 are repeated for each other memory location transferring the contents to the next adjacent memory location. Function 27 can be implemented with the loop counter approach described in connection with FIG. 2.

In connection with the embodiments of the invention shown in FIGS. 1-3, it should be emphasized that while the steps illustrated employ the accumulator, of course that is not essential to the invention and any available register can be employed instead so long as the processor has appropriate capabilities. Furthermore, it should also be noted that the step of FIGS. 1-3 employs an instruction such as instruction 34, instruction 23 or instruction 14, to increment the contents of a particular memory location. This is an instruction which is available in the specified INTEL microprocessor family but of course those skilled in the art will understand that another equivalent instruction or instructions could be used to effect the same purpose.

In the event the methods of FIGS. 1-3 are implemented on an INTEL 4048 family microprocessor, or other suitable computer, it should be apparent to those skilled in the art that the steps of the methods illustrated in FIGS. 1-3 are stored, in other memory areas, in the form of instructions. These instructions can be considered firmware, whether in the form of software (i.e. stored in R/W memory) or in hardware (i.e. stored in an ROM).

Figure 4:
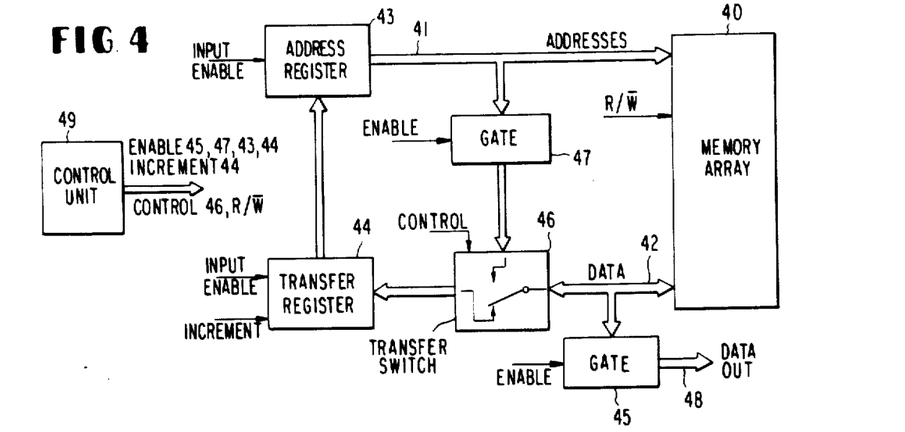

FIG. 4 is a discrete logic arrangement suitable for effecting the methods shown in FIGS. 1-3, and other methods employing the invention. As shown in FIG. 4, a memory array 40 is controlled by the illustrated apparatus. The memory array 40 can be any conventional read/write memory array which is capable of being addressed and written and/or read. This memory array includes an address input, via address bus 42, an input/output port coupled to a bidirectional data bus 42 and a control R/$\overline{W}$ input to determine whether or not the memory is to read data at the addressed location and place the data on the data bus, or to write into the addressed memory location the data on data bus 42.

Address bus 41 is controlled by the address register 43, and also provides an input to a gate 47. The output of the gate 47 is coupled to a transfer switch 46, which has another input from the bidirectional data bus 42. The bidirectional data bus also provides an input to a gate 45, which has an output data bus 48. The transfer switch 46 provides an input to a transfer register 44, which provides an output to address register 43. The control unit 49 develops signals to enable registers 43, 44 and gates 45 and 47 to increment the contents of the transfer register 44, to control the transfer switch 46 and the R/$\overline{W}$ control for memory array 40. Transfer switch 46 may comprise an array of electronic gates, switches or electromechanical switches subject to the control signal from the control unit 49.

Reviewing FIG. 4 in connection with the method of FIG. 1, the address register 43 corresponds to the data pointer used in FIG. 1, and it should be apparent that any address can be set into the address register 43 via the transfer register 44. In order to exchange the contents of an addressed memory location with the data in the data pointer, memory 40 may first be addressed with the transfer switch 46 controlled to couple the data bus to the transfer register, whereafter the data in the addressed memory location may be output via the data bus in gate 45 to the data out bus 48. Subsequently, the memory array 40 is addressed by the same address in the address register 43, but the memory has written therein that address, coupled via the address bus 41, the gate 47 to the transfer switch 46 to the data bus 42.

The memory location contents can be incremented by reading out the memory location via data bus 42 through transfer switch 46 to the transfer register 44; data is incremented in the transfer register 44. Thereafter, the incremented contents of the transfer register are coupled to the address register 43, and steps 11-15 can be repeated to write an address in the newly addressed memory location.

Figure 5:
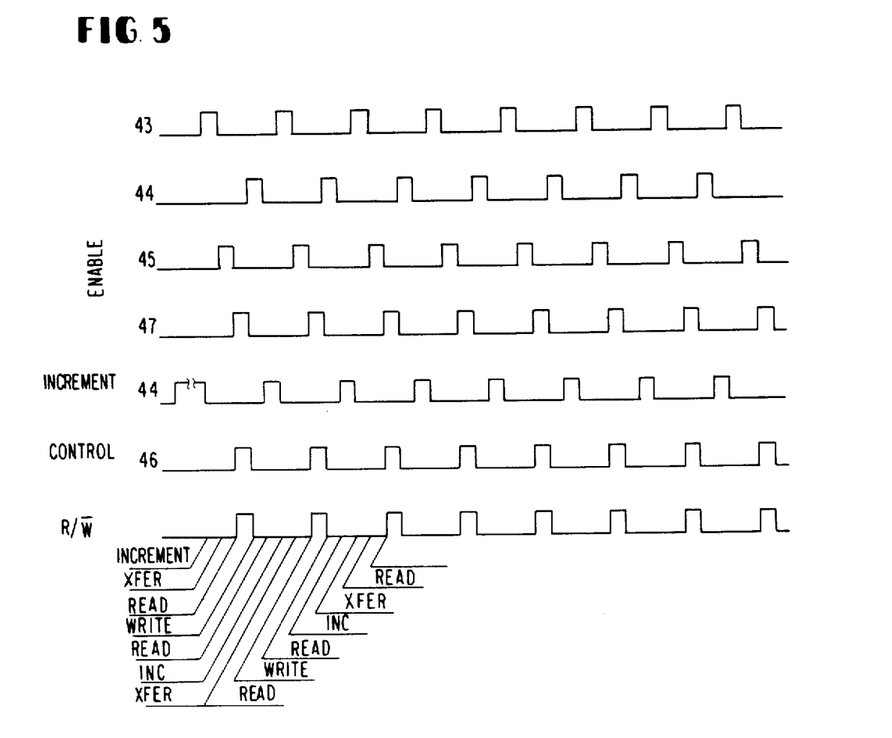
FIG. 5 shows typical operating waveforms for the embodiment of FIG. 4.

FIG. 5 illustrates the waveforms used to enable the gates 45 and 47, registers 43 and 44, the transfer switch and the R/$\overline{W}$ control lines. The convention used in FIG. 5 is that the presence of a signal enables the associated gate or register, the transfer register 44 is incremented each time the signal 44 is present, the transfer switch 46 normally couples the data bus 42, to the transfer register 44 except in the presence of a signal when it couples the output of gate 47 through the data bus 42, and the memory writes when the R/W signal is low. The cycle of operation, once the address register 43 is initialized comprises four operations: a reading of the addressed memory location and the subsequent writing therein of its own address (corresponding to functions 12 and 13), a reading of the memory location and an incrementing of the transfer register 44, and a transfer to register 43 (corresponding to functions 14 and 15).

In order to implement the functions of steps 17 and 18, a comparator can be provided, coupled to the address bus, to make the comparison contained in step 16, and an additional gate can be provided coupled to the data bus 42 to move the test word to the address location (function 18).

Figure 6A:
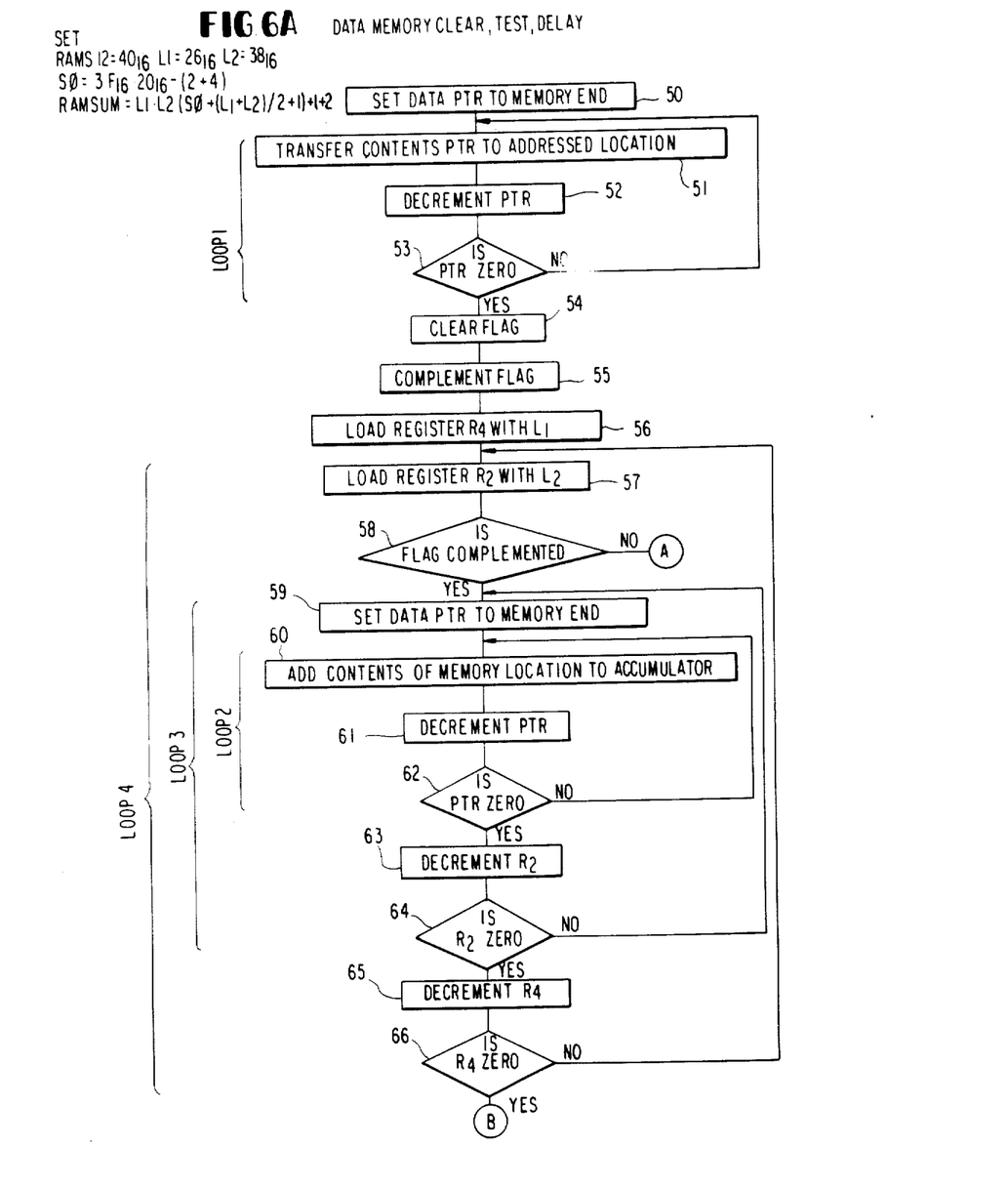
Figure 6B:
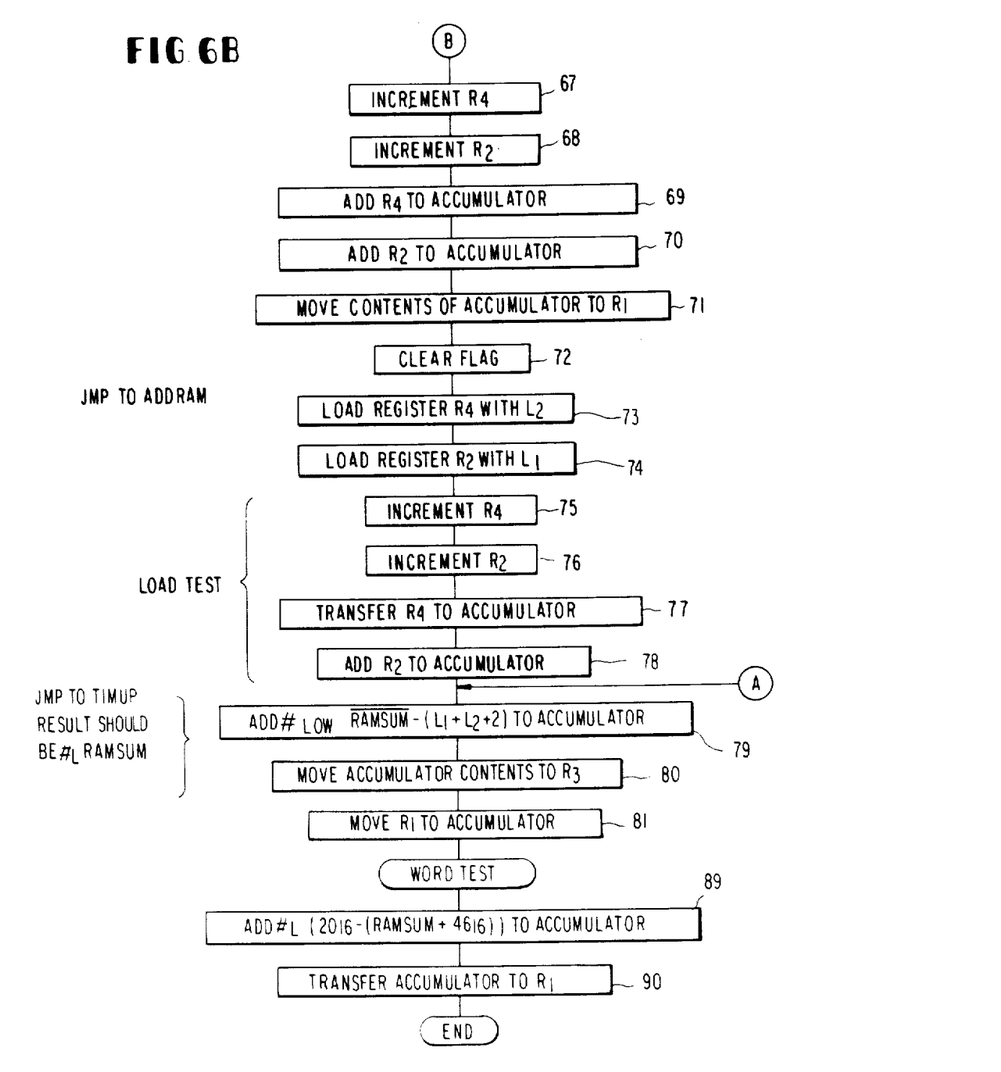
Figure 6C:
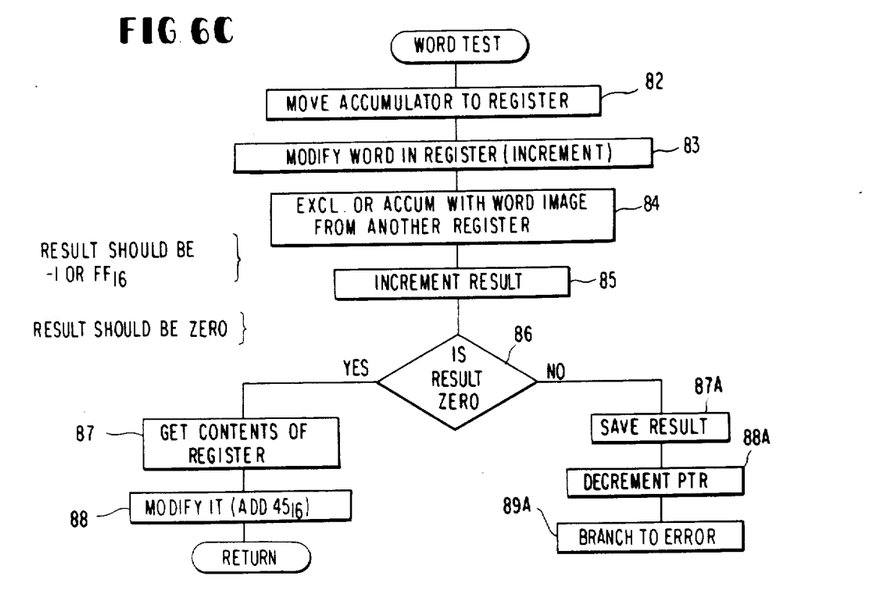

Attached hereto as Appendix A is source statement for the INTEL MCS48 Microprocessor family for effecting the data clearing, data memory test and start delay, and FIGS. 6A through 6C is a corresponding flow diagram. Referring first to FIG. 6A, the parameters used in one embodiment of the invention, related to the specified processor, are noted in the upper lefthand corner of the figure; these parameters were employed for a RAM of 64 (40$_8$) bytes. These parameters are set, in the source statement at lines 44–48 (see Appendix A).

Initially, function 50 sets a data pointer to a location in the RAM memory, in the specific embodiment shown in FIG. 6A, the pointer is set to the memory end, or the memory location with the highest address. Function 51 transfers the contents of the pointer to the addressed location, function 52 decrements the pointer and function 53 determines if the pointer is zero. Since the pointer had begun pointing at the highest addressed location, at the first execution of function 53 the pointer contents are not zero, therefore a loop back is effected to function 51. The loop of functions 51–53 is repeated a sufficient number of times so that the pointer is decremented to zero after the pointer has addressed each of the memory locations and function 51 has written the location's address therein. Note in addition, that function 51 is effected, in the source statement via lines 18-19, whereby the contents of the pointer is first moved to the accumulator, and then the pointer is used to address the addressed location and move the contents of the accumulator therein.

Functions 54 and 55 clear a flag and then complement it. The use of the flag will be made clear hereinafter.

Functions 56 and 57 load registers R4 and R2 with the previously defined quantities L1 and L2, respectively.

Function 58 checks to see if the flag is complemented, and since that function was just accomplished at function 55, the routine continues on to function 59. Function 59 again sets the data pointer as did function 50, and function 60 adds the contents of the addressed memory location to the accumulator. Note that because of function 51, the accumulator had contained the address of the first memory location and thus, the result of function 60 is the sum of the address of the memory location with the highest address, plus 1. Function 61 then decrements the pointer, and function 62 determines if the pointer has been decremented to zero. If the pointer is not zero, the routine loops back and performs function 60 again; this time addressing the next adjacent memory location. The loop of function 60-62 is performed once for each memory location, and when the pointer has been decremented to zero, at function 62 the accumulator is storing a quantity equal to one more than the sum of all the memory location addresses. When the pointer is detected as having been decremented to zero, function 63 is performed to decrement the register R2, and function 64 determines if that register is zero. If it is not, the routine loops back to function 59 and repeats the entire sequence. The sequence is repeated a number of times equal to the quantity stored in R2 (the parameter L2). After that loop has been completed the predetermined number of times, and therefore the contents in the register R2 is zero, function 65 decrements the register R4, and function 66 determines whether or not that register contains the quantity zero. If it does not, the routine lopps back to function 57, and the loop of function 57-65 is repeated a number of times equal to the quantity originally stored in register R4. Note that this loop includes reloading the register R2 with a quantity L2 each time that quantity had been decremented to zero.

Referring now to FIG. 6B, function 67 is performed after the above-mentioned loop has been iterated a number of times equal to the quantity originally stored in the register R4. Functions 67 and 68 increment the quantities in the registers R2 and R4, and since these quantities have previously been zero, each now contains the quantity one. Function 69 adds the contents of register R4 to the accumulator, and function 69 adds the contents R2 to the accumulator. Just previous to function 69, the accumulator had stored a quantity corresponding to the repeated summation of the contents of all the memory locations. Note in this regard, that since the registers R2 and R4 are contained within the memory location whose contents are summed, each iteration of summation is effected with a different quantity in the register R2, and likewise for the register R4.

Function 71 then moves the contents of the accumulator (the previously accumulated sum plus the incremented contents of the registers R2 and R4) to a register R1. Function 72 clears the flag, indicating that the summation has been completed, and then functions 73 and 74 again load the registers R4 and R2 with the predefined quantities L2 and L1. Functions 75 and 76 increment these quantities respectively. Functions 77 and 78 thereafter transfer and add the incremented quantities to the accumulator. The results of functions 73-78 is to produce a sum in the accumulator equal to L1+L2+2. Function 79 then adds a predetermined quantity to the accumulator. The predetermined quantity is shown in FIG. 6B to be the difference between low order byte of the complement of RAMSUM defined in line 48 of the source statement (Appendix A) and the sum is L1+L2+2. The result of this addition is to leave, in the accumulator, the complement of the low order byte of RAMSUM. Function 80 thereafter moves the accumulator contents to register R3. Thus, at this point in the routine, register R1 stores RAMSUM (as a result of execution of function 71) and register R3 stores the complement (as the result of function 80). Thereafter, function 81 moves the contents of register R1 to the accumulator and the sub-routine Word Test is entered.

Briefly, Word Test (the flow chart of which is shown in FIG. 6C) compares the contents of the registers R3 and R1, and exits with a successful test if they are complementary, as they should be if the program is executed properly. Before further discussing FIG. 6B, reference is now made to FIG. 6C which illustrates the flow chart of Word Test.

As shown in FIG. 6C, function 82 moves the contents of the accumulator to an unused register. When function 82 is performed, the accumulator has had stored therein the quantity from register R1, which is RAM-SUM. Function 83 thereafter modifies the word in the register involved in the operation of function 82. The specific example shown in FIG. 6C is incrementing the contents of that register.

Function 84 now performs an exclusive OR function between the contents of the accumulator and its complement (obtained from register R3, loaded at function 80). Accordingly, if the program has executed properly, the result of function 84 should be $FF_{16}$. Function 85 thereafter increments this result which should leave the quantity zero in the accumulator. Function 86 tests for this zero, and if the quantity in the accumulator is not zero, functions 87 to 89 are performed, which leads to an error recovery routine, since detection of a nonzero quantity in the accumulator is indicative of some error. On the other hand, if the quantity in the accumulator is zero, then function 87 gets the contents of the register involved in function 83, and function 88 again modifies it. In the specific example shown in FIG. 6C, this modification is effected by adding a fixed quantity thereto ($45_{16}$). The result of the modification at functions 83 and 88 will be taken into account as will be explained hereinafter. When the routine returns, function 89 is executed and it should be noted that function 89 is only executed in the event Word Test, at function 86, is successfully completed. Function 89 adds a quantity to the accumulator (shown in detail in FIG. 6B).

Prior to effecting function 89, function 88 leaves in the accumulator the quantity RAMSUM+$46_{16}$. When function 89 is performed, the result is to leave the quantity $20_{16}$ in the accumulator. And this sum is prepared for use as a check word then, at function 90, it is transferred to a specified register. Accordingly, the specified register will only contain the specified quantity if, and only if, the data memory is first cleared and tested, and the routines affecting these functions are also tested. It is possible, although extremely unlikely, that some spurious circumstance will cause that very same register to maintain the specific quantity $20_{16}$, however, it should be noted this quantity is not otherwise stored anywhere in any of the fields associated with the functions of FIGS. 6A–6C. Since that probability is vanishingly small, the existence of that quantity in the specified register is taken as an indication that all functions have been successfully executed.

In the specific embodiment of the invention disclosed in connection with the source statement of Appendix A, the delay is approximately 2 seconds for each execution. Accordingly, effecting the functions shown in Appendix A each time the processor is restarted (by reason of a noise interruption, power failure of the like) produces a two second delay in its output. This delay, in many applications is sufficient so that the output will not appear to any other device in the system as being continuous. Of course, in other applications, the time of two seconds may be varied, and Appendix A clearly shows the manner in which any appropriate time delay can be effected merely by changing the quantities L1 and L2. At the same time, Appendix A also identifies the effect on the delay time of using larger or smaller RAM's.

Those skilled in the art will, in view of the foregoing description, be capable of making many and varied changes therein all within the spirit and scope of the invention.

The embodiments disclosed herein are illustrative, and the scope of the invention is to be determined by the appended claims.

Figure 7A:
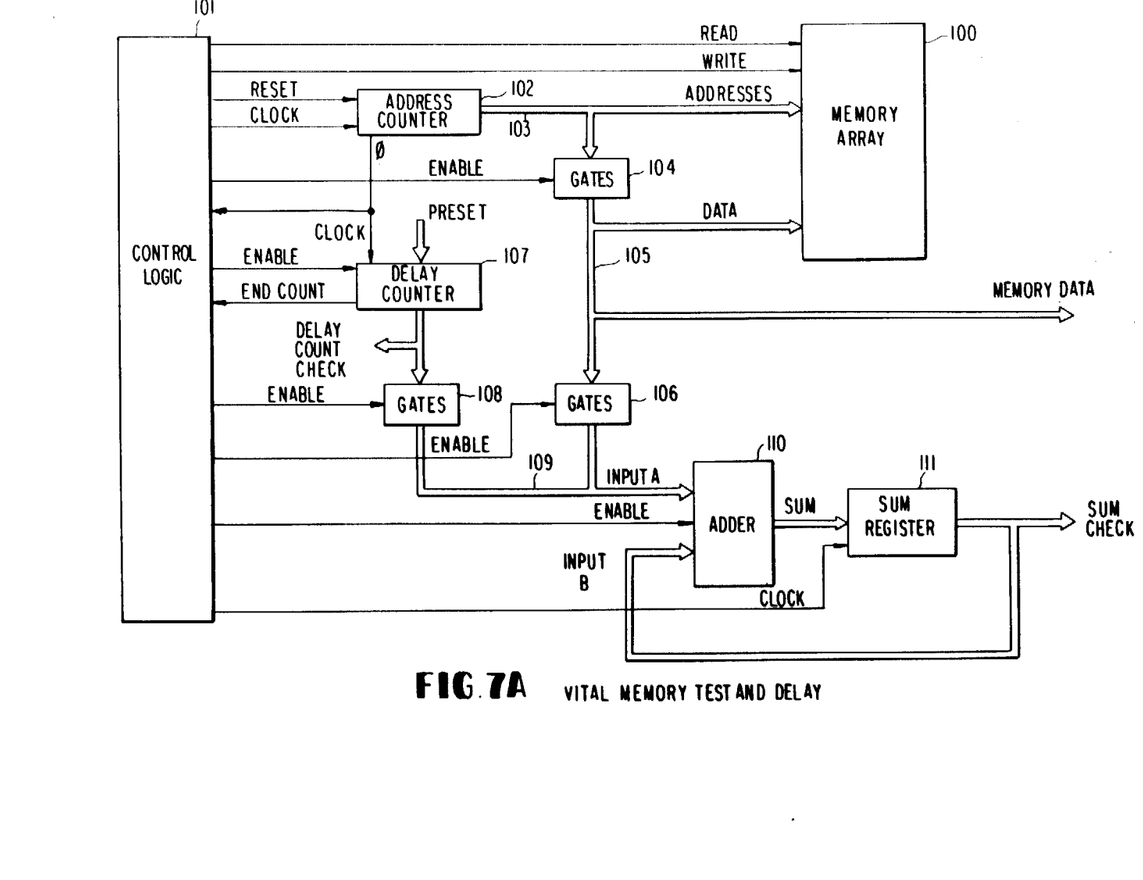
FIGS. 7A and 7B provide block diagrams of other embodiments to perform the function shown in FIGS. 6A-6C.
Figure 7B:
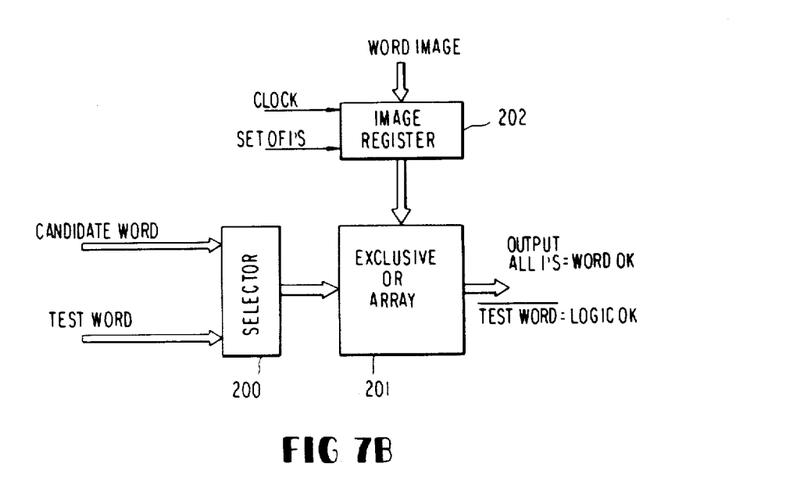

While the preceding description of FIGS. 6A–6C, and Appendix A are provided in the context of the use of random logic, such as found in a microprocessor, it should be understood that that is not at all essential to the invention and, if desired, a special purpose machine or discrete logic can be employed to implement the functions of FIGS. 6A–6C. To illustrate this statement, FIGS. 7A and 7B are referred to; FIG. 7A implementing the memory test and delay functions of FIGS. 6A and 6B and FIG. 7B implementing the Word Test logic of FIG. 6C.

Referring first to FIG. 7A, a vital memory test and delay circuit is illustrated to operate on the contents of a memory array 100, which can be any conventional read/write addressable memory array. The vital memory test and delay circuit includes a control logic 101 in order to generate appropriate control and clocking signals as will be more particularly described hereinafter. In addition, a multi-digit address counter 102 is controlled by RESET and CLOCK signals from the control logic 101 and provides a multi-digit output to an address bus 103 which is coupled as an input to the memory array 100 and gates 104. The gates 104 are controlled by the ENABLE signal from the control logic 101. The gates 104 are coupled to a bus 105 providing three different parallel signal paths, a data path coupled to the data input of the memory array 100, a memory data path which is in effect an output of the memory 100, and can be coupled and used by auxiliary apparatus, and an input to gate 106 which is also controlled by a further ENABLE Signal from the control logic 101.

A zero count output of the address counter 102 is provided as the clocking input to a delay counter 107, which can be preset via its preset input to a predetermined count. The delay counter 107 also responds to an ENABLE input from the control logic 101 and in turn provides an end of count signal to the control logic 101. A multi-digit output of the delay counter 107 is provided through a bus 108 providing two parallel data paths, a first delay count check output, the function of which will be described hereinafter, and the second path which provides an input to gates 108, which are also controlled by an ENABLE Signal from the control logic 101. The output of gates 108 and 106 are provided to a bus 109 which provides a first input (input A) to an adder 110, which also responds to an ENABLE input from the control logic 101. The sum register 111 provides an output on a bus 112 which has two parallel paths, a first sum check path, the function of which will be described hereinafter, and a second path which provides the second input (input B) to adder 110.

The apparatus of FIG. 7A is arranged to sum the contents of the memory array 100, after it has been loaded with predetermined data, the summation is used as a check that the array 100 has indeed been so loaded. In preferred embodiments of the invention, the predetermined data for each location is the address of the location.

In a first phase of operation the address counter 102 is arranged to point to a first memory location in array 100 with which it is desired to operate. This location is addressed and via gates 104 its address is written therein. Each other memory location, within the range of addresses to be operated on, is similarly written with its own address similar to functions 50-53.

Thereafter, the checking operation may commence. Delay counter 107 is preset (similar to function 56 or 57), the address counter 102 is set to a desired address and the apparatus adds the contents (address) of each location via adder 110 to accumulate a sum in register 111 using gates 106. This sum can be increased by the quantity in counter 107, at any time, by enabling gates 108. For example, after a first pass through the array 100, when address counter 102 produces a zero count output to decrement counter 107, the corresponding output to logic 101 is used as the enable signal for gates 108.

The same operation is repeated a number of time equal to the sum initially preset into counter 107 (corresponding to functions 59-64), that is until counter 107 produces an end count signal. If desired, this sequence is repeated a number of times, under control of logic 101, as shown, for example in functions 65, 66 and 57. The result of this processing is a quantity in register 111. The output path SUM CHECK Allows a comparison of the result produced by the summation to determine if the test was successful. Note that in addition to the memory test, the apparatus of FIG. 7A also delays the production of a successful/unsuccessful signal by the time taken to perform the test, much as in the manner the execution of the function in FIGS. 6A-6C does.

FIG. 7B illustrates apparatus to perform the Word Test shown in flow diagram form in FIG. 6C. This employs a first source of a candidate word, input through the selector 200 to the exclusive OR array 201. The word test operates to compare a candidate word with a separately generated word image. In a typical application, the candidate word may be either derived during the course of processing as is shown in FIGS. 6A and 6B, or derived from a table entry. In either case, the word image can be derived from a further table entry, and the test is effected to ensure that the candidate word and word image are complements of each other. To perform the test, the word image is located in image register 202. When the test is performed, the image register 202 provides the word image to the exclusive OR array 201, and the selector 200 provides the candidate word thereto. The output of the exclusive OR array may be all 1's to indicate that the test was successfully passed. In order to ensure that the test itself is operating correctly, periodically a test word is subject to the test. The test periodically a test word is subject to the test. The test word may be stored at another predetermined location and when a test is desired, selector 200 inputs the test word to the exclusive OR array. Rather than using another storage location to store the word image for the other input to the test, the image register 202 is set to all 1's. When a word is exclusively ORed with another word made up of all 1's the result is the complement of the word. Accordingly, if, during the time that the word testing logic itself is being tested, the exclusive OR array 201 produces the complement of the test word, this indicates successful completion of the test. Of course, the output of the exclusive OR array 201 can be provided to a comparator which is selectively enabled to compare the output with a word made up of all 1's to indicate that the word test was successfully passed in normal operation, or to compare the output of the exclusive OR array to the complement of the test word to indicate that the test of the word testing logic was successfully passed.

APPENDIX A

| LINE | | SOURCE STATEMENT |
|---|---|---|
| 1 | TITLE | DATA MEMORY TEST AND START DELAY. |
| 4 | CLRRAM: | CLEAR AND TEST DATA MEMORY (RAM CONTENTS ARE ADDED L1*L2 TIMES TO PROVIDE SYSTEM START DELAY). DELAY = APPROXIMATELY L1*L2*3(R−1)*I. L1*L2 = LOOP COUNT R = RAM SIZE I = INSTRUCTION EXECUTION TIME L1=26, L2=38, R=40 & I=16. 0.005 MS GIVES APPROXIMATELY 2 SECONDS |
| 13 | | JMP LOOP 1; BYPASS INTRRPT LOC'S |
| 15 | | ORG $10_{16}$ |
| 17 | | MOV R0, #$3F_{16}$; POINT TO TOP OF RAM |
| 18 | LOOP 1: | MOV A, R0; MOVE CONTENTS OF R0 TO LOCATION POINTED TO BY R0 |
| 19 | | MOV a R0, A |
| 20 | | DJNZ R0, LOOP 1 |
| 21 | | CLR F1 |
| 22 | | CPL F1 |
| 23 | ADDRAM: | MOV R4, #L2; LOAD LOOP COUNTERS |
| 24 | LOOP 4 | MOV R2, #L1 |
| 25 | | JF1 Loop 3; SKIP LOAD TEST |
| 26 | LODTST: | INC R4 |
| 27 | | INC R2 |
| 28 | | MOV A, R4 |
| 29 | | ADD A, R2 |
| 30 | | JMP TIMUP; LOAD AGAIN |
| 31 | LOOP 3: | MOV R0, #RAMSIZ−1 |
| 32 | LOOP 2: | ADD A, a R0; SUM CONTENTS OF RAM |
| 33 | | DJNZ R0, LOOP 2 |
| 34 | | DJNZ R2, LOOP 3; REPEAT TO DELAY START |
| 35 | | DJNZ R4, LOOP 4 |
| 36 | | INC R4; TEST LOOP COUNTERS FOR ZERO |
| 37 | | INC R2 |
| 38 | | ADD A, R4 |
| 39 | | ADD A, R2 |
| 40 | | MOV R1, A; SAVE SUM |
| 41 | | CLR F1; TEST LOOP COUNTERS |
| 42 | | JMP ADDRSM |
| 44 | RAMSIZ | EQU $40_{16}$; INTEL 8048 RAM |
| 45 | L1 | EQU $26_{16}$; L1+L2 MUST BE AN EVEN NUMBER |
| 46 | L2 | EQU $38_{16}$ |
| 47 | S0 | EQU $3F_{16}$*$20_{16}$−(2+4); LOOP CTRS = R2 & R4 |
| 48 | RAMSUM | EQU L1*L2(S0+(L1+L2)/2+1)+1+2 |
| 50 | TIMUP | ADD A, #LOW (NOT RAMSUM) − (L1+L2+2) |
| 51 | | MOV R2, A; LOAD TEST IMAGE |
| 52 | | MOV A, R1; GET SUM |
| 53 | | CALL WRDTST: TEST CHECK WORD |
| 54 | | ADD A, #LOW ($20_{16}$−(RAMSUM + $46_{16}$) |
| 55 | | MOV R1, A; INIT CHK WORD PTR |
| 57 | WRDTST | |
| 59 | END | |

What is claimed is:

1. A method useful in assuring that a computer memory area is cleared of pre-existing data before employing said memory area, which memory area is located between initial and final addresses, and is addressed by a pointer, comprising the sequential steps of:

(a) initially loading said pointer with an address to a memory location between said initial and final addresses, thereby defining an addressed memory location, (b) writing a pre-determined data word into said addressed memory location so that the addressed memory location contains said pre-determined data word, (c) modifying the contents of said addressed memory location in a pre-determined fashion so that the modified contents of said addressed memory location can be used to address a different memory location in said memory area, (d) rewriting the pointer with the modified contents of the addressed memory location to address a further memory location, (e) and repeating said steps (b)–(d) for other memory locations within said memory area.

2. The method of claim 1 wherein said predetermined data word, of step (b) is a function of the address of said location, but not the address of said location.

3. The method of claim 2 wherein said predetermined fashion of step (c) comprises incrementing said contents, and said step (a) comprises loading said pointer with said initial address.

4. The method of claim 2 wherein said predetermined fashion of step (c) comprises decrementing said contents, and said step (a) comprises loading said pointer with said final address.

5. The method of claim 2 in which said pre-existing data is extracted comprising an additional step, after step (a) but before stop (b) of reading said addressed location.

6. The method of claim 1 which includes a further step, subsequent to step (e) of testing the contents of said memory area to ensure that said memory area contains predetermined contents, loaded therein, in repeated iterations of steps (b) and (c).

7. The method of claim 2 wherein said predetermined data word is a number, n, less than the address of said addressed memory location, and said predetermined fashion of step (c) comprises the step of adding the quantity $n+1$, to the contents of said addressed memory location.

8. The method of claim 2 wherein said predetermined data word of step (b) is a number, n, more than the address of said addressed memory location, and said predetermined fashion of step (c) comprises subtracting the quantity $n-1$ from the contents of said addressed memory location.

* * * * *